US006555748B1

United States Patent
Gul (10) Patent No.: US 6,555,748 B1
(45) Date of Patent: Apr. 29, 2003

(54) SENSOR ASSEMBLY WITH HOUSING FOR SECURE SENSOR CONNECTIONS

(75) Inventor: S. Asim Gul, Orono, MN (US)

(73) Assignee: Mamac Systems, Inc., Eden Prairie, MN (US)

( * ) Notice: Subject to any disclaimer, the term of this patent is extended or adjusted under 35 U.S.C. 154(b) by 0 days.

(21) Appl. No.: 10/105,772

(22) Filed: Mar. 25, 2002

(51) Int. Cl.7 ................................................ H02G 3/18

(52) U.S. Cl. ............................ 174/59; 174/59; 73/431; 361/724; 361/825; 361/826; 361/679

(58) Field of Search ............................. 174/59; 73/431; 361/679, 825, 826, 724

Primary Examiner—Dean A. Reichard
Assistant Examiner—Anton Harris
(74) Attorney, Agent, or Firm—Kinney & Lange, P.A.

(57) ABSTRACT

A sensor assembly for use with a separate control unit has a housing with a cradling bracket, a sensor, and a connection socket. The housing has a sensor face, sides, a cradling bracket and a lid. The sensor face defines a sensor opening and a flange connection surface. Sides extend from the sensor face and attach at adjacent edges to form an enclosure with a lid opening. The cradling bracket is within the enclosure. The lid is sized to fit the lid opening and adapted for releasable attachment to the enclosure. The sensor has a sensing element, a flange member, and electrical leads. The sensing element senses a parameter through the sensor opening. The flange member extends from the sensing element and is fixedly attached to the sensing element. The flange member attaches the sensor to the flange connection surface of the housing. Electrical leads extend from the sensing element and terminate in terminal ends. The connection socket is attached to the terminal ends of the electrical leads. The connection socket has openings for receiving wires from the control unit to electrically connect with the electrical leads of the sensor. The connection socket is sized to mate with and be cradled by the cradling bracket. The cradling bracket and the lid cooperate in a closed position to prevent the connection socket from moving during use.

20 Claims, 5 Drawing Sheets

SENSOR ASSEMBLY WITH HOUSING FOR SECURE SENSOR CONNECTIONS

CROSS-REFERENCE TO RELATED APPLICATION(S)

None.

BACKGROUND OF THE INVENTION

The present invention relates to housings for electrical connections, and more particularly, to housings for electrical connections for use with leads on sheathed and flanged probes, allowing for easy installation of the probes.

Sensor assemblies, including housings and sensors, have long been used in buildings and residences for housing sensors and electrical connections between the sensor and a control unit. For example, one type of sensor assembly includes a sensor for measuring room temperature, such as in a thermostat. The sensed environmental parameter is then communicated via leads to an electrical circuit, and an electrical signal is transmitted to an HVAC control system. In a residence, the thermostat may contain both the sensor and the control system; however, in large buildings, multiple sensors may be separate from a single control unit. Multiple sensor/single control unit systems may also be used in many other environments, such as in industrial control systems, vehicles (e.g., airplanes or engines), etc.

Generally, the housing protects the electrical connection between the sensor leads and control system wires from potential harm. Such harm includes jarring, bending or stressing the electrical connection, as well as damaging the connections by exposure to dust and light. Additionally, the housing provides an aesthetically pleasing holder for the wires. The housings must be inexpensive, and are typically formed of low cost materials and with low cost manufacturing methods, such as injection molding of plastic. The housings must be durable to withstand physical abuse during installation and during the useful life of the unit. The housings must also be aesthetically pleasing and small, as they may be within view on a wall of a building.

Unfortunately, sensor assemblies are sometimes difficult to install. Typically, the housings are designed to be small so as not to be noticed, and the small housing makes it difficult to connect the wires. Additionally, assemblies are often installed in out of the way areas, tight spaces, or difficult locations, to properly position the sensor or to assist in making the housing and sensor less noticeable. Because of the placement of the housings, access to the housing may be limited after installation. Additionally, the electrical leads from the sensor and/or control unit wires are typically short and difficult to work with, in part because the housing is too small to hold a lot of extra wire.

A new sensor assembly is required for easy testing, installation and maintenance of the sensor and the electrical connections. The new sensor assembly must allow a worker to use standard tools to make the electrical connection easily, even after the housing has been installed and even with limited access.

BRIEF SUMMARY OF THE INVENTION

A sensor assembly for use with a separate control unit has housing components and sensor components. The housing has a sensor face, sidewalls attached at adjacent edges to form an enclosure, and a lid. The sensor face defines a sensor opening and a flange connection surface. The sensor has a sensing element, a flange member, and electrical leads. The sensing element sense a parameter through the sensor opening in the sensor face. In one aspect of the invention, the housing is molded plastic, and the sensor is attached to the housing with rivets. In another aspect, a connection socket is attached on terminal ends of the sensor leads. A cradling bracket is defined within the enclosure, which mates with the connection socket. The cradling bracket and the lid cooperate in when the housing is closed to prevent the connection socket from moving during use.

While the above identified FIGS. 1–7 set forth preferred embodiments, other embodiments of the present invention are also contemplated, some of which are noted in the discussion. In all cases, this disclosure presents the illustrated embodiments of the present invention by way of representation and not limitation. Numerous other minor modifications and embodiments can be devised by those skilled in the art which fall within the scope and spirit of the principals of this invention.

DETAILED DESCRIPTION

Figure 1:
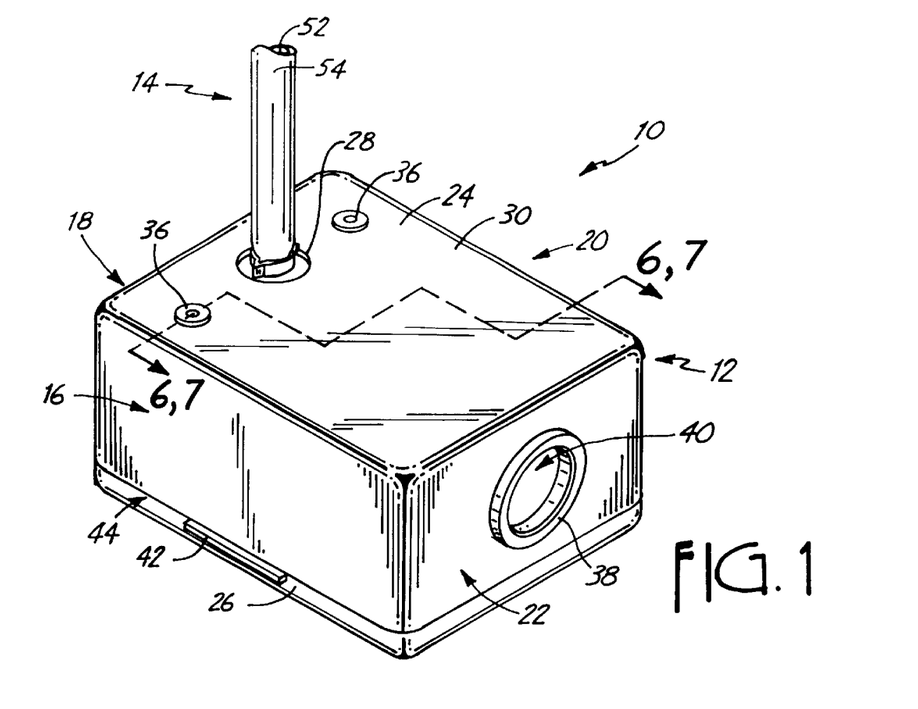
FIG. 1 is a side plan view of the housing and sensor of the present invention.
Figure 2:
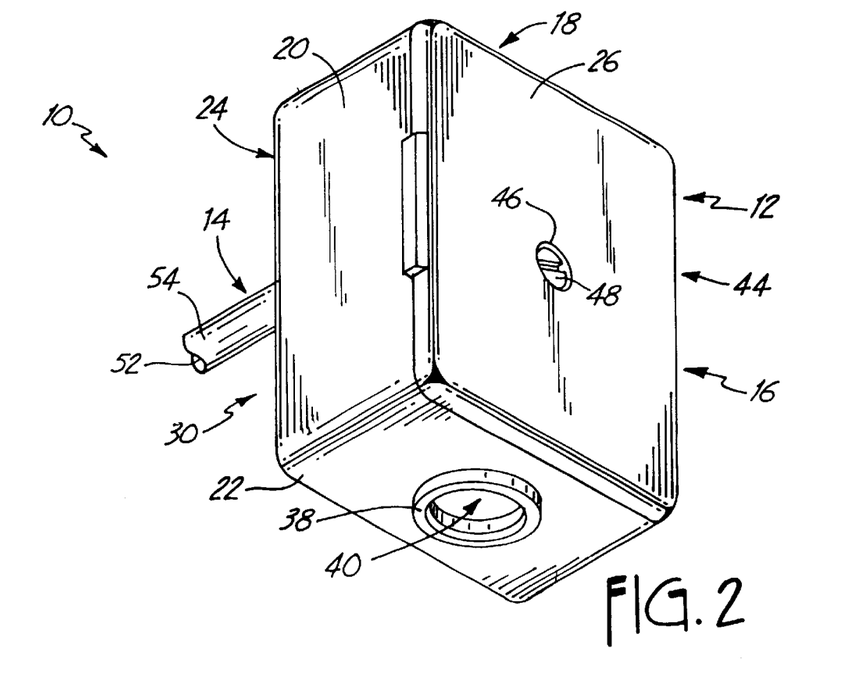
FIG. 2 is a rear plan view of the housing and sensor of FIG. 1.

As shown in FIGS. 1 and 2, an electrical connection assembly 10 has a housing 12 and a probe or sensor 14. The present invention involves attachment of the probe 14 to the housing 12 and the electrical connection of electrical leads from the sensor 14 to electrical leads from the building or HVAC control unit within the housing 12.

The housing 12 has sidewalls 16,18,20,22, a sensor sidewall 24, and a cover or lid 26. A sensor opening 28 is formed in the sensor sidewall 24. The sidewalls 16,18,20,22 extend from the sensor sidewall 24, forming an enclosure 30 with a lid opening 32 (shown in FIG. 4). A lid 26 is separately formed and is sized to fit the lid opening 32 to close the enclosure 30. The sensor 14 may include a gasket 34 (shown in greater detail in FIG. 4 and 6). Rivets 36 attach the sensor 14 to the housing 12. An annular extension 38 on the housing 12 defines a wire opening 40.

Sensor 14 senses an HVAC parameter through a sensor opening 28 on the sensor sidewall 24 of the housing 12. While many different sensor structures can be used, the present invention particularly contemplates use with a sheathed and flanged temperature probe 14 best shown in FIG. 3. In particular, the preferred temperature probe 14 is that taught in pending U.S. patent application Ser. No. 09/635,034, filed Aug. 4, 2000 and entitled SHEATHED AND FLANGED TEMPERATURE PROBE, which is incorporated herein by reference. A sensing element (not separately shown) is located on a distal portion of the probe 14 that is outside of the housing 12. The sensor 14 includes a flange member 50 placed around a probe 52 with a cylindrical, metal sheath 54. The flange member 50 includes a flange 56 and a sleeve 57. The flange 56 is generally planar, and extends generally normal to the axis of the probe 14. Fastener holes 58 are positioned on the flange 56 a significant distance away from the sleeve 57. A proximal end 60 of the sensor 14 extends a short distance beyond the flange 56, and electrical leads 62 extend from the proximal end 60 of the sensor 14. The electrical leads 62 may be sealed within the metal sheath 54 such as with epoxy, silicone, or any other sealant.

Figure 3:
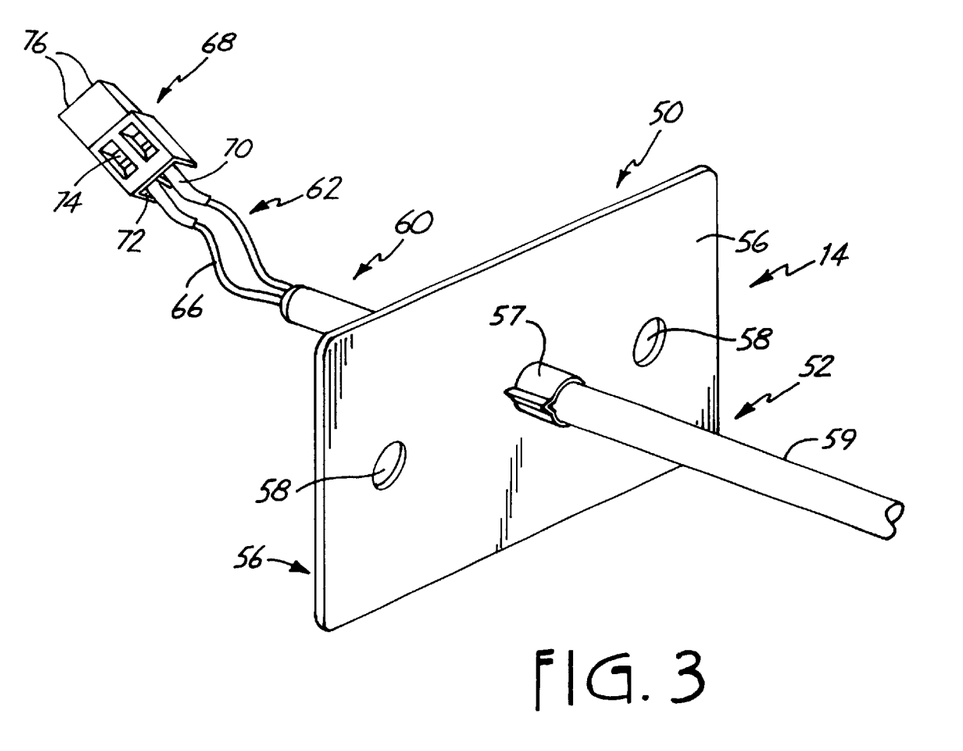
FIG. 3 is a perspective view of the preferred temperature probe of the FIG. 1.

The leads 62 are flexible wires which allow electrical connection of the sensor 14. Typically, the leads 62 are provided within an electrically insulative sheath 66. The sheath 66 may be stripped from the leads 62 at the terminal ends of the leads 62 so that making the electrical connection is easier.

Figure 4:
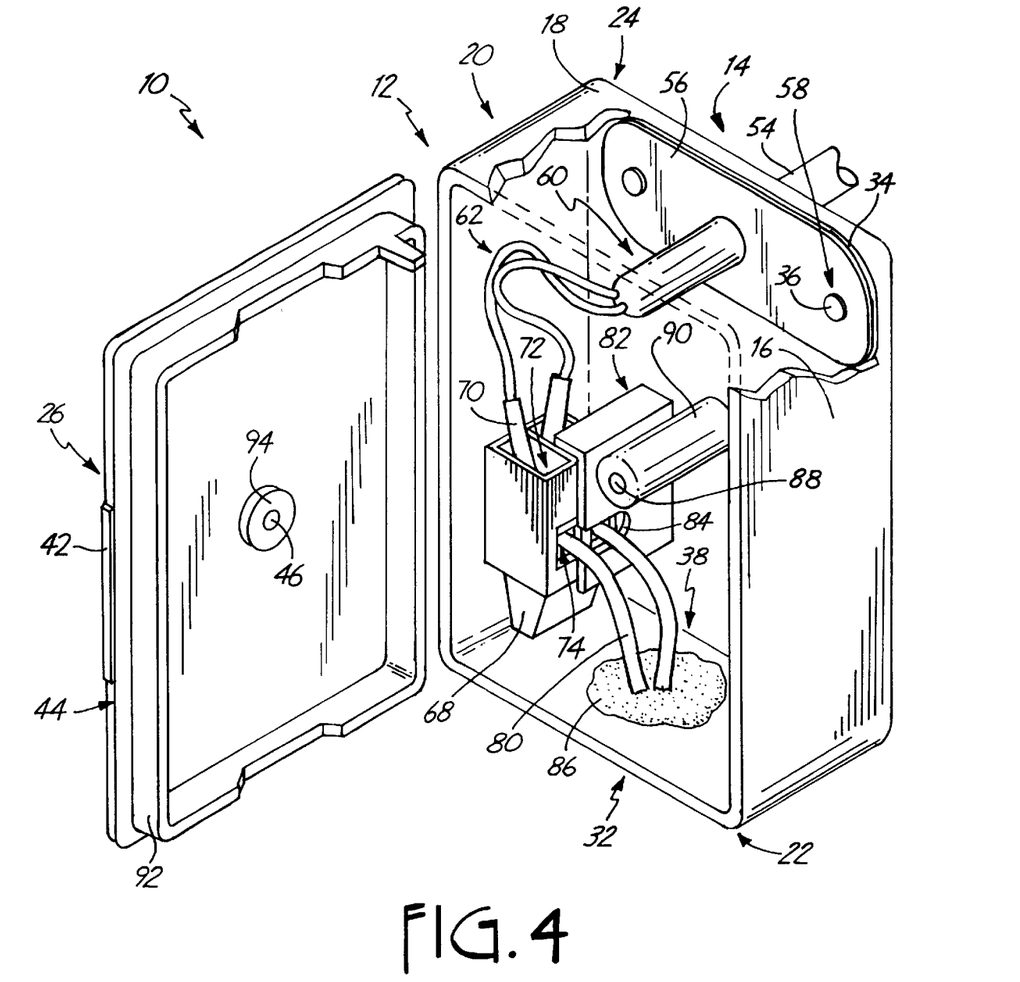
FIG. 4 is a rear plan view of the housing and sensor of FIG. 1 with the housing open to expose the inside.
Figure 5:
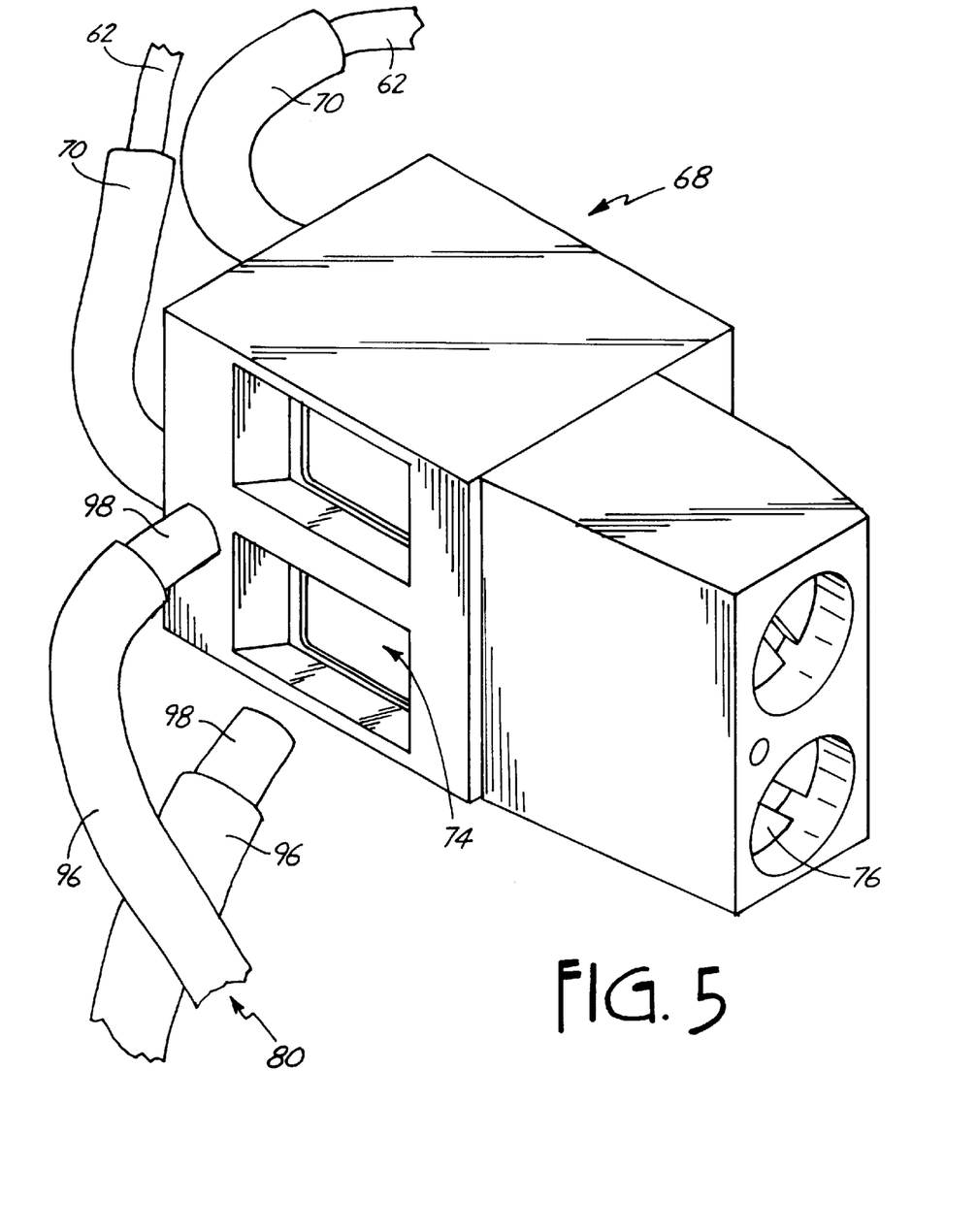
FIG. 5 is a side plan view of the electrical connection socket.
Figure 6:
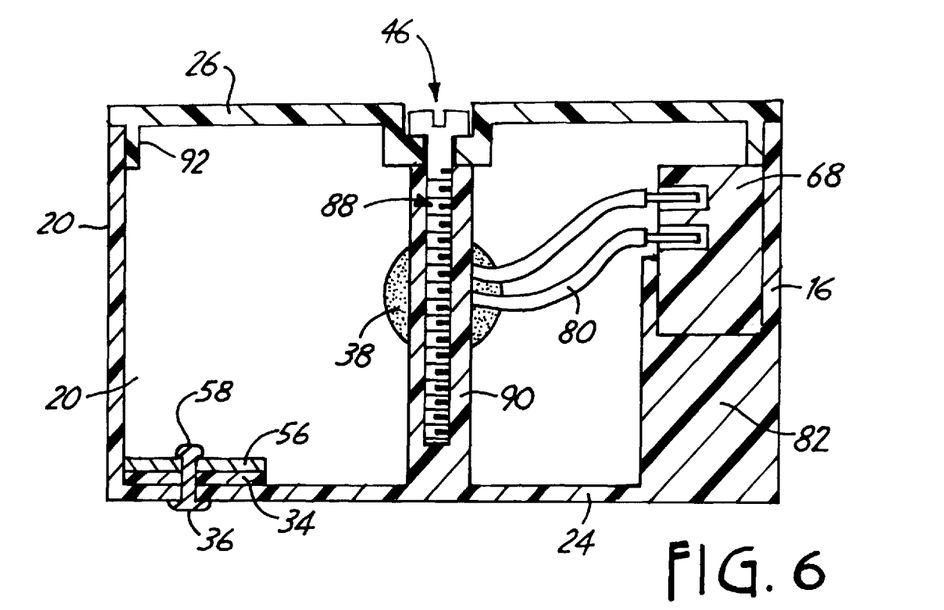
FIG. 6 is a cross-section taken along line 6—6 of FIG. 1.

The leads 62 of the sensor 14 terminate in a connection socket 68 best shown in FIGS. 3–5. As shown in FIG. 4, the socket 68 forms an electrical junction between leads 62 and wires 80. The socket 68 is formed of an electrically insulative material such as molded from plastic. Socket 68 defines lead openings 72 and wire openings 74. The leads 62 are connected to the socket 68 and insulated such as through shrinkwrap or heatwrap 70. The leads 62 terminate inside of shrinkwrap 70 in the lead openings 72 in the socket 68. The electrical connection socket 68 is generally formed of an electrically insulative material formed around an electrically conductive strip. Connection screws 76 are recessed into the bottom surface of the electrical connection socket 68 to tighten down onto the wires 80 to ensure a good electrical connection between the wires 80 and the leads 62. Alternatively, both the leads 62 and the wires 80 may be fixed to sockets that can be snapped together to facilitate and assist in maintaining the electrical connection.

In the preferred embodiment, the leads 62 extend a distance sufficient to extend outside the housing 12, such that the leads 62 are sufficiently long to be able to extend outward from the housing 12 in any direction, including through the wire opening 40. By making the leads 62 sufficiently long to extend outside the housing, a worker can establish the electrical connection even after the housing 12 is mounted to a structure. The proximal end 60 of the probe 14 extends a short distance into the housing 12. In the preferred embodiment, the length of the electrical leads 62 is sufficiently long to extend from the proximal end 60 of the probe 14 beyond the perimeter of the lid opening 32 in any direction.

Generally, the housing 12 is formed of an electrically insulative material. In the preferred embodiment, the housing 12 is molded from plastic as a single molded unit. In the preferred embodiment shown, the molded housing 12 is formed in a generally rectangular shape having dimensions approximately 2.5 inches high, 2 inches wide, and 1.25 inches deep. In alternative embodiments, the housing may be circular or have other shapes. With this size of housing, the leads 62 of the sensor 14 need to be about 1.5 inches long or longer to enable the leads 62 to fully extend beyond the perimeter of the enclosure 30 opening (shown in FIG. 4) in any direction.

The sensor opening 28 is sized to allow the sleeve 54 on the preferred sheathed and flanged sensor 14 to extend through the sensor opening 28 from inside the enclosure 30. The sensor opening 28 may be of any shape or dimension, provided the flange 56 is permitted to abut the sensor wall 24. In the preferred embodiment shown, the sensor opening 28 is circular and has a diameter of approximately 3⁄8th inches.

In the preferred embodiment, rivets 36 fixedly attach the flange 56 to the housing 12, to hold the sensor 14 in place. The rivets 36 are fixed through the fastener holes 58 in the flange 56 and through the sensor sidewall 24 of the housing 12. In the preferred embodiment, the flange 56 is located on the inside of the enclosure 30, because assembly by inserting the distal end of the probe 14 through the sensor opening 28 is easier than assembly by threading the leads 62 through the sensor opening 28. Further, the assembly 10 is more aesthetically appealing with the flange 56 within the enclosure 30. However, the flange 56 could equivalently be positioned on the outside of the housing. By using rivets 36, the manufacturing process is fast, cost efficient and simple. The rivets 36 are preferably of a type which form a seal between the rivet 36 and the underlying plastic structure of housing 12. In an alternative embodiment, screws or other similar types of fasteners may be used in place of the rivets 36.

A gasket 34 (shown in greater detail in FIG. 4 and 6) may be used to provide a seal between the flange 56 (shown in FIGS. 3, 4 and 6) and the sensor opening 28. The gasket 34 is preferably formed of an elastomer or a compressible closed cell foam material. The gasket 34 is pinned between the flange 56 and the interior surface of the sensor sidewall 24 of the housing 12 along the entire contact surface. Because the gasket 34 is compressible, it absorbs some of the compression created by the rivets 36, so the riveting process does not cause failure of the underlying, relatively brittle plastic material of the housing 12.

Figure 7:
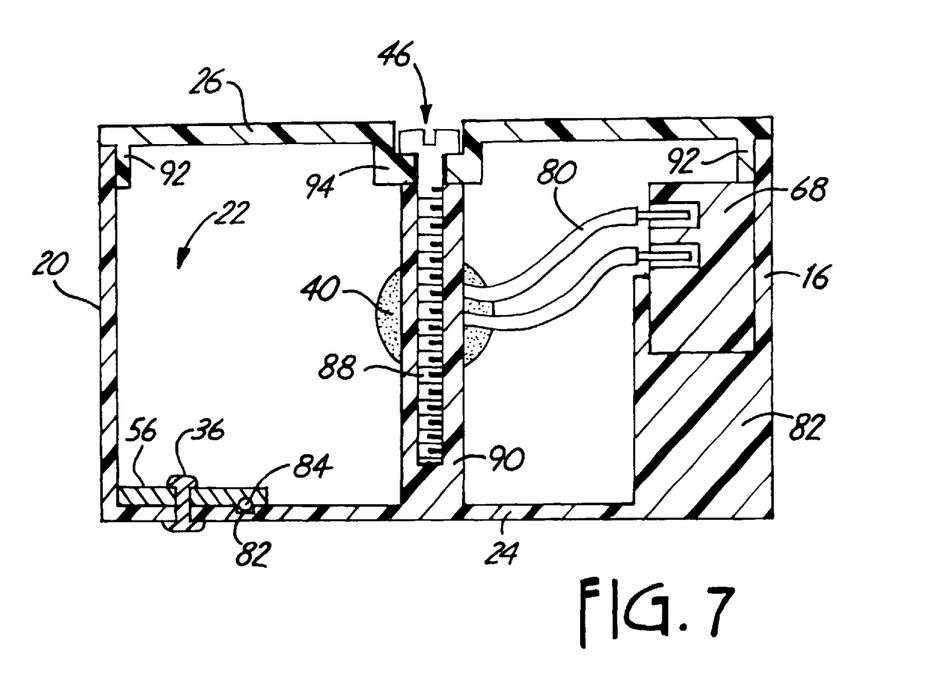
FIG. 7 is a cross-sectional view similar to FIG. 6 of an alternative embodiment of the present invention.

Alternative to the gasket 34, as shown in FIG. 7 a groove 82 may be formed in the plastic material of the housing 12 immediately around the sensor opening 28. An o-ring 84 is then positioned in the groove 82 to provide a seal. Similar to the gasket 34, the o-ring 84 absorbs some of the compression of the rivets 36, so the rivets 36 do not crack the housing 12. The riveting process when used in conjunction with the seal (either the o-ring 84 or the gasket 34) has been found to result in a surprisingly low failure rate, while providing a robust, effective attachment. When either the gasket 34 or the o-ring 84 is used, the housing 12 can achieve a NEMA-4 rating to provide a sufficient degree of protection to personnel against incidental contact with the enclosed electrical connections and to provide a sufficient degree of protection against falling dirt, rain, sleet, snow, windblown dust, splashing water, and hose-directed water.

One of the sidewalls 16,18,20,22 of the housing 12 defines a wire opening 38 for receiving electrical wires 80 (shown in 4 and 5) from the HVAC control unit (not shown). The HVAC control unit is thus separate from the sensor assembly 10, electrically connected by wires 80 through the walls of a building. As shown, the wire opening 38 in the sidewall 20 of the housing 12 extends the entire thickness of the sidewall 20 to allow wires from the wall to extend into the housing 12. Generally, the wire opening 38 could be defined in any sidewall 16,18,20,22, in the sensor sidewall 24 spaced from the sensor opening 28, or even in the lid 26. By positioning the wire opening 38 on a sidewall 20, the wires 80 can easily run along a wall while the probe 14 extends normal to the wall and the cover 26 can be removed in a direction normal to the wall. Further, because wires 80 generally run at an angle to the sensor sidewall 24, any strain applied to the wires 80 is not likely to be transferred to the leads 62, regardless of how the leads 62 are arranged within the enclosure 30.

The wire opening 38 is circumscribed by an annular extension 40. This annular extension 40 provides a seat for an elastomeric covering 86 (shown in FIG. 4). The annular extension 40 helps to hold the elastomeric covering 86 in place. The elastomeric covering 86 assists in sealing the housing 12 around the inserted wires 80 to NEMA-4 rating. Additionally, the annular extension 40 and the elastomeric covering 86 cooperate to provide strain relief for the electrical connections within the housing 10, by transferring any strain on wires 80 to the housing 12, instead of to the wire connections inside the housing 12.

The lid 26 is sized to mate with the enclosure 30 and fit the lid opening 32. Removal of the lid 26 allows access to the enclosure 30 for connecting and disconnecting the sensor 12 with the external control system. The lid includes several features which simplify its use, including a continuous ridge 92, a lid grip 42, and a recessed fastener opening 46.

The lid 26 is formed with a continuous ridge 92 along the inside surface of the lid 26. The edges 44 of the lid 26 are aligned with the planar outside surface of the sidewalls 16,18,20,22 to form a smooth connection when the lid 26 is in place. Ridge 92 is spaced from the edges 44 of the lid 26 and sized to fit snugly within the lid opening 32 of the enclosure 30. The ridge 92 assists in guiding the lid 26 into position and holding the lid 26 in position during tightening of the screw 48. The ridge 92 also serves as a seal between the lid 26 and the sidewalls 16,18,20,22.

The lid 26 preferably provides a lid grip 42. Lid grip 42 extends from an edge 44 of the lid 26 beyond the profile of the enclosure 30. The lid grip 42 assists a worker in the field in gripping the lid 26. Typically, a corresponding lid grip 42 is provided on opposite edges 44 of the lid 26 so that the worker can grip the lid from opposing sidewalls for better leverage. A worker can use the lid grips 42 to pry the lid 26 from the enclosure 30 in order to access the electrical connections within the housing 12. In an alternative embodiment, a lid grip may be provided as a recess into the edge 44 of the lid 26 for receiving the tip of a standard screw driver or a fingernail to pry the lid 26.

In the preferred embodiment shown in FIG. 1, the lid grip 42 is an extension, which extends longitudinally along an edge 44 of the lid 26 approximately ⅓rd of a full length of the edge 44 of the lid 26. In the preferred embodiment, the lid grip 42 extends laterally from the edge 44 of the lid 26 approximately 1 mm. The lid grip 42 narrows as it extends from the edge 44, from a thickness of approximately 2 mm at the lid edge 44 to approximately 1 mm thick at the tip of the lid grip 42 (1 mm from the edge 44). In tight spaces, it may be difficult to access the lid edges 44 with a tool, depending on placement of the assembly 10. By providing lid grips 42 as extensions, a worker can easily remove the lid 26 using only his or her fingers.

A threaded fastener or screw 48 may be used to releasably fasten the lid 26 to the enclosure 30 to close the housing 12 over the electrical connections. The preferred lid 26 defines a fastener opening or screw hole 46 which is recessed down to a receiving surface 94. The receiving surface 94 provides a base for the head of the screw 48. By being recessed, the head of the screw 48 does not project above the flat surface of the lid 26.

A corresponding threaded screw-receiving hole 88 (shown in FIG. 4) is provided in the housing 12 on the interior surface of the sidewall opposite the lid 26 for receiving the screw 48. The preferred threaded hole 88 is tapped in a cylinder 90. The cylinder 90 is preferably integrally formed with the interior surface of the sensor sidewall 24 of the housing 12. With the lid 26 properly aligned due to the ridge 92, a screw 48 inserted through the screw hole 46 will align with the threaded hole 88 of the fastener guide or cylinder 90 on the interior surface of the sensor sidewall 24 of the housing 12.

A bracket 82 is provided in the housing 12 to support the electrical junction socket 68. The bracket 82 should be shaped to mate with the shape of the socket 68 in a cradling relationship. If desired, the socket 68 may snap into the cradling bracket 82, but the preferred cradling bracket 82 does not include such a snap. The preferred bracket 68 (together with sidewalls 18 and 20) prevents movement of the socket 68 in any direction other than away from sidewall 24. During use or operation of the sensor assembly 10, the lid 26 prohibits movement of the socket 68 in the remaining direction.

The bracket 82 is preferably integrally formed as part of the housing 12. If desired however, the bracket 82 may alternatively be formed separately from the sidewall 22 and subsequently attached to the sidewall 22. Having bracket 82 be detachable would provide some flexibility in selecting a bracket 82 which properly mates with the socket 68 for any given probe.

The preferred bracket 82 includes a U-shaped opening 84. U-shaped opening 84 avoids interference with the wires 80 while the socket 68 is being supported. In the orientation shown in FIG. 4, the bracket 82 forms an upside down L-shape. With this "L" shape, the electrical leads 62 from the probe end 60 are adjacent the base of the "L" when the socket 68 is pushed into the bracket 82, but the bracket 82 does not interfere with the leads 62.

The bracket 82 extends less than a full depth and less than a full height of the connection socket 68. Generally, the bracket 82 may be of any size sufficient to cradle the socket 62 and prevent the socket from moving in at least three directions. By having the bracket 82 extend less than full depth and less than full height of the connection socket 68, a worker can easily grasp the socket 68 to remove the socket 68 from its cradling bracket 82 when desired.

During use, the lid 26 cooperates with the bracket 82 to secure the socket 68 in a fixed position. Specifically, the ridge 92 extends from the lid 26 sufficiently to contact the socket 68. This contact prevents the socket 68 from moving toward the lid 26.

By preventing movement of the socket 68 after the connections are made, several benefits are achieved. The life of the electrical connection is extended. Specifically, movement of the wires 80, the leads 62 and the socket 68 can wear or loosen the electrical connection and lead to sensor failure. In fixed environments such as where the housing 12 is mounted to a fixed structure such as a wall or beam, movement of the wires 80, the leads 62 and the socket 68 is minimal. However, sensors may be used in various environments and situations, including within moving vehicles, within fluid flows, and so on. Incidental movements, such as bumping or jarring during mounting of the housing 12, bumping or jarring of the housing 12 after installation, air or fluid ebbs and flows, and installation of the housing 12 within a moveable structure (such as a car engine, and so on), should not jeopardize the electrical connection within the electrical connection socket 68. Since the socket 68 is cradled and held still by the bracket 82 and the ridge 92 of the lid 26, the electrical connection itself is not subject to stresses caused by such motion. By securing the electrical connection in a socket 68 that is held by a bracket 82, the stress on the connections is reduced in the event of movement, shaking, and so on. Additionally, in particularly sensitive capacitive measurements, movement of the wires 80 or the leads 62 may induce measurable current fluctuations or may cause changes in the electrical connection, which may in some instances affect the accuracy of the sensor readings. Finally, with the bracket 82 being positioned to the side of the fastener receiving opening 84, the socket 68 is unlikely to interfere with fastening of the lid 26 to the housing 12. Thus, the bracket 82 improves the durability of the electrical connection, provides a location for placement of the connection that does not interfere with the lid 26 or the fastener, and which will not be disturbed by sudden or unexpected movements or vibrations.

The sensor assembly 10 of the present invention makes the installation process easy for the worker in the field. Typically, the wires 80 are pushed through the wire opening 38. Then, the wire ends 98 and the socket 68 are pulled out of the housing 12 through the lid opening 32, where the electrical connection can be made easily. Finally, the socket 68 is pushed into the bracket 82, and the lid 26 is placed over the lid opening 32 to close the housing 12. The lid 26 and the bracket 82 cooperate to prevent the socket 68 from moving during operation.

The wires 80 from the wall or from the HVAC control unit are typically insulated. The insulation 96 of the wires 80 can be stripped from the wires 80 to expose the wire ends 98, which are then pushed into openings 74 in the socket 68 to complete the electrical connection with the temperature probe 14 via the electrically conductive strips within the socket 68.

Instead of requiring the field worker to establish and fix the connection inside the housing 12, the socket 68 on the end of leads 62 extends outside the housing 12 so that the electrical connection with the wires 80 can be made outside of the housing 12, and the socket 68 can then be pushed back into the housing 12 and into the cradling bracket 82. This arrangement wherein the electrical connection can be completed outside the housing 12 makes the entire assembly 10 simple and easy to install and maintain. Additionally, the u-shaped opening 84 in the cradling bracket 82 allow the socket 68 to be pushed into the bracket 82 after the electrical connections are made without interfering with the wires 80.

Sheathed wires 80 extend from the wall (not shown) through the wire opening 38 and into the wire openings 74 on the electrical junction socket 68. Screws or other fasteners 76 in the bottom of the electrical junction socket 68 are then tightened to secure and maintain the connection between the leads 62 from the probe 14 and the wires 80 from the wall or HVAC control unit.

The present invention provides an effective and simple, easily installed, and durable housing 12 for the electrical connections between a sheathed and flanged sensor and a HVAC control unit. Although the present invention has been described with reference to preferred embodiments, workers skilled in the art will recognize that changes may be made in form and detail without departing from the spirit and scope of the invention.

What is claimed is:

1. A sensor assembly for use with a separate control unit, the sensor assembly comprising:
    a housing comprising:
        a sensor face with a sensor opening, the sensor face having a flange connection surface;
        sidewalls extending from the sensor face and attached at adjacent edges to form an enclosure with a lid opening;
        a cradling bracket within the enclosure; and
        a lid sized to fit the lid opening, the lid being releasably attachable to the enclosure;
    a sensor comprising:
        a sensing element for sensing a parameter through the sensor opening;
        a flange member extending from the sensing element and fixedly attached to the sensing element, the flange member attaching the sensor to the flange connection surface of the housing; and
        electrical leads extending from the sensing element, the electrical leads terminating in terminal ends; and
    a connection socket on the terminal ends of the electrical leads, the connection socket having openings for receiving wires from the control unit to make electrical connection with the electrical leads of the sensor, the connection socket being sized to mate with and be cradled by the cradling bracket;
    wherein the cradling bracket and the lid cooperate in a closed position to prevent the connection socket from moving during use.

2. The sensor assembly of claim 1, wherein the cradling bracket is integrally formed with the enclosure.

3. The sensor assembly of claim 1, wherein the enclosure and the lid are formed from electrically insulative materials.

4. The sensor assembly of claim 1, wherein the flange member is fixedly attached to the flange connection surface using rivets.

5. The sensor assembly of claim 1, further comprising a seal disposed between the flange member and the flange connection surface, the seal being formed from compressible material which is more compressible than the relatively rigid material of the flange member and the housing.

6. The sensor assembly of claim 1, wherein the lid comprises a recessed opening receiving a fastener which releasably attaches the lid over the lid opening of the enclosure.

7. The sensor assembly of claim 1, wherein the lid comprises a continuous ridge extending from an interior lid surface, the continuous ridge being spaced from an outer edge of the lid to fit within the lid opening.

8. The sensor assembly of claim 7, wherein the cradling bracket extends from a sidewall of the housing adjacent the lid opening, and wherein the continuous ridge cooperates with the lid in a closed position to prevent the connection socket from moving during use.

9. The sensor assembly of claim 1, wherein the sensor has a proximal end and a distal end defining a lengthwise axis, with the flange member extending generally normal to the lengthwise axis, wherein the flange member attaches the sensor to the housing such that the distal end of the sensing element extends away from the housing, and wherein the electrical leads extend from the proximal end of the sensing element within the enclosure.

10. The sensor assembly of claim 9, wherein the sensor is a sheathed sensor having a sensor probe disposed within a sheath defining the longitudinal axis, and wherein the sheath extends outside the housing to position the distal end of the sensor away from the housing.

11. A sensor assembly for use with a separate control unit, the sensor assembly comprising:
    a housing comprising:
        a sensor face with a sensor opening, the sensor face having a flange connection surface;
        sidewalls extending from the sensor face and attached at adjacent edges to define an enclosure with a lid opening; and
        a lid sized to fit the lid opening, the lid being releasably attachable to the enclosure;
    a sensor comprising:
        a sensing element having a proximal end and a distal end defining a lengthwise axis;
        a flange member extending rigidly from the sensing element generally normal to the lengthwise axis; and electrical leads extending from the proximal end of the sensing element within the enclosure; and rivets fixedly attaching the flange member of the sensor to the flange connection surface of the housing such that the distal end of the sensing element extends away from the housing; and a seal disposed between the flange member and the flange connection surface, the seal being formed from compressible material which is more compressible than the relatively rigid material of the flange member and the housing.

12. The sensor assembly of claim 11, wherein the seal is provided by a gasket extending full length and width of the flange member such that the gasket forms a seal around the sensor opening and the rivets.

13. The sensor assembly of claim 11, wherein one of the flange connection surface and the flange member define a groove circumscribing the sensor opening, and wherein the seal is provided by an o-ring disposed in the groove.

14. The sensor assembly of claim 11, further comprising:

a wire opening in one sidewall of the housing for receiving wires from the separate control unit into the enclosure.

15. The sensor assembly of claim 11, wherein the wire opening comprises:

an annular ring circumscribing the wire opening; and an elastomeric covering around the wires seated on the annular ring.

16. The sensor assembly of claim 11, wherein the lid comprises:

a grip extension extending from at least one edge of the lid beyond a profile of the housing.

17. The sensor assembly of claim 11, wherein the electrical leads terminate in terminal ends; wherein the housing further comprises a cradling bracket within the enclosure; and wherein the sensor further comprises a connection socket on the terminal ends of the electrical leads, the connection socket having openings for receiving wires from the control unit in electrical connection with the electrical leads of the sensor, the connection socket being sized to mate with and be cradled by the cradling bracket.

18. A method for electrically connecting a sensor assembly to a separate control unit, the method comprising:

positioning exposed ends of insulated wires from the separate control unit within a connection socket, the connection socket forming electrical connection between the insulated wires and leads from a sensor, the sensor being secured to a housing, the housing comprising:

a sensor face with a sensor opening, sidewalls extending from the sensor face and attached at adjacent edges to form an enclosure with a lid opening;

a cradling bracket within the enclosure, the cradling bracket being sized to mate with and receive the connection socket; and a lid sized to fit the lid opening, the lid being releasably attachable to the enclosure;

placing the connection socket into the cradling bracket; and releasably attaching the lid over the lid opening, such that the cradling bracket and the lid cooperate in a closed position to prevent the connection socket from moving during use.

19. The method of claim 18, wherein the act of positioning comprises:

pushing the exposed ends of the insulated wires into wire openings in the connection socket, each wire opening providing wire access to a conductive strip in electrical communication with one of the leads from the sensor; and tightening a screw onto the exposed end of each insulated wire to press the insulated wire against the conductive strip, to thereby secure and maintain electrical connection between the insulated wire and its respective lead from the sensor.

20. The method of claim 18, wherein the housing comprises a threaded hole, and wherein the releasably attaching act comprises:

placing the lid over the lid opening such that a recessed screw hole in the lid aligns with the threaded hole; and tightening a screw through the recessed screw hole and into the threaded hole such that a head of the screw attaches the lid to the housing with the lid covering the lid opening.

* * * * *

UNITED STATES PATENT AND TRADEMARK OFFICE
CERTIFICATE OF CORRECTION

PATENT NO. : 6,555,748 B1  Page 1 of 1
DATED : April 29, 2003
INVENTOR(S) : S. Asim Gul It is certified that error appears in the above-identified patent and that said Letters Patent is hereby corrected as shown below:

<u>Title page,</u>
Item [56], References Cited, U.S. PATENT DOCUMENTS, insert the following cited prior art references:

| | | | |
|---|---|---|---|
| -- 5,592,803 | Canada et al. | 09-14-99 | 318/558 |
| 5,698,975 | Kayserman | 12-16-97 | 324/207 |
| 6,155,114 | Karino et al. | 12-05-00 | 73/493 -- |

Signed and Sealed this

Eighteenth Day of May, 2004

JON W. DUDAS
*Acting Director of the United States Patent and Trademark Office*